(12) United States Patent
Hayashi

(10) Patent No.: US 8,885,164 B2
(45) Date of Patent: *Nov. 11, 2014

(54) EXPOSURE METHOD, EXPOSURE APPARATUS, AND METHOD OF MANUFACTURING DEVICE

(71) Applicant: Canon Kabushiki Kaisha, Tokyo (JP)

(72) Inventor: Nozomu Hayashi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/759,319

(22) Filed: Feb. 5, 2013

(65) Prior Publication Data

US 2013/0148123 A1 Jun. 13, 2013

Related U.S. Application Data

(63) Continuation of application No. 12/370,827, filed on Feb. 13, 2009, now Pat. No. 8,390,809.

(30) Foreign Application Priority Data

Feb. 29, 2008 (JP) ................................. 2008-051114

(51) Int. Cl.
- *G01B 11/00* (2006.01)
- *G03F 9/00* (2006.01)
- *G01B 11/14* (2006.01)

(52) U.S. Cl.
CPC .............. *G01B 11/14* (2013.01); *G03F 9/7003* (2013.01); *G03F 9/7046* (2013.01)
USPC ............................. 356/401; 356/399; 356/400

(58) Field of Classification Search
USPC ................................................ 356/399–401
See application file for complete search history.

(56) References Cited

U.S. PATENT DOCUMENTS

| 5,003,342 A | * | 3/1991 | Nishi .............................. 355/43 |
| 5,623,343 A | | 4/1997 | Nara et al. |

(Continued)

FOREIGN PATENT DOCUMENTS

| JP | 2000-156336 A | 6/2000 |
| JP | 2001-267229 A | 9/2001 |

(Continued)

OTHER PUBLICATIONS

Japanese Office Action cited in U.S. Appl. No. 12/370,827, filed Feb. 13, 2009.

*Primary Examiner* — Tarifur Chowdhury
*Assistant Examiner* — Isiaka Akanbi
(74) *Attorney, Agent, or Firm* — Rossi, Kimms & McDowell LLP

(57) ABSTRACT

An exposure method comprises: a first detection step of detecting a position of a first mark by a first scope; a second detection step of detecting a position of a second mark by a second scope having a magnification higher than the first scope; a first calculation step of calculating a first correction value based on the detection results obtained in the first and second detection steps; a third detection step of detecting a position of a third mark by the second scope after the substrate is aligned based on the first correction value calculated in the first calculation step; a second calculation step of calculating a second correction value based on the detection results obtained in the second and third detection steps; and an exposure step of exposing the substrate after the substrate is aligned based on the second correction value calculated in the second calculation step.

8 Claims, 6 Drawing Sheets

(56) References Cited

U.S. PATENT DOCUMENTS

| | | |
|---|---|---|
| 5,731,113 A | 3/1998 | Ueno |
| 5,815,594 A | 9/1998 | Tanaka |
| 6,930,016 B2 * | 8/2005 | Mishima et al. ............. 438/401 |
| 6,992,766 B2 | 1/2006 | Tanaka et al. |
| 2003/0053058 A1 | 3/2003 | Tanaka |
| 2003/0053059 A1 | 3/2003 | Mishima et al. |

FOREIGN PATENT DOCUMENTS

| | | |
|---|---|---|
| JP | 2003-092246 A | 3/2003 |
| JP | 2003-092248 A | 3/2003 |
| JP | 2004-158741 A | 6/2004 |
| JP | 2005-217333 A | 8/2005 |

* cited by examiner

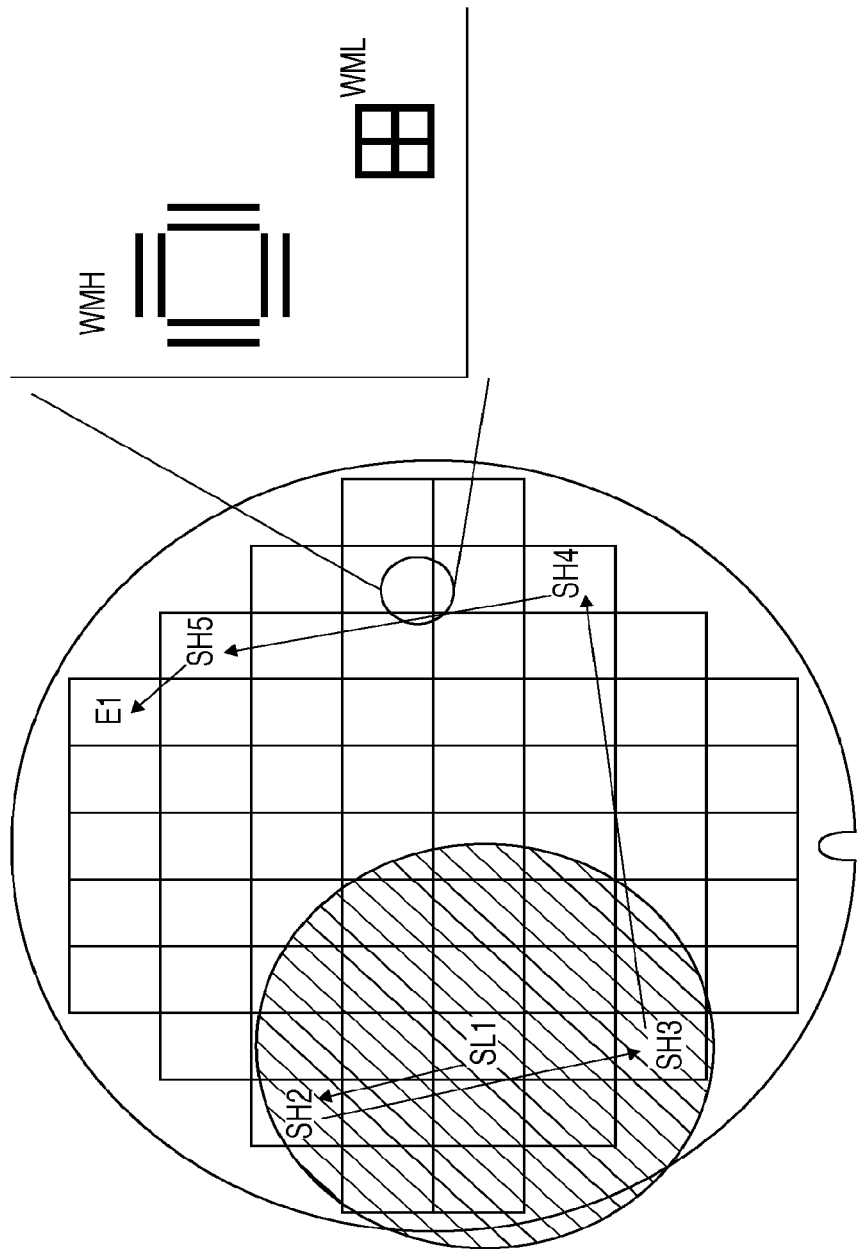

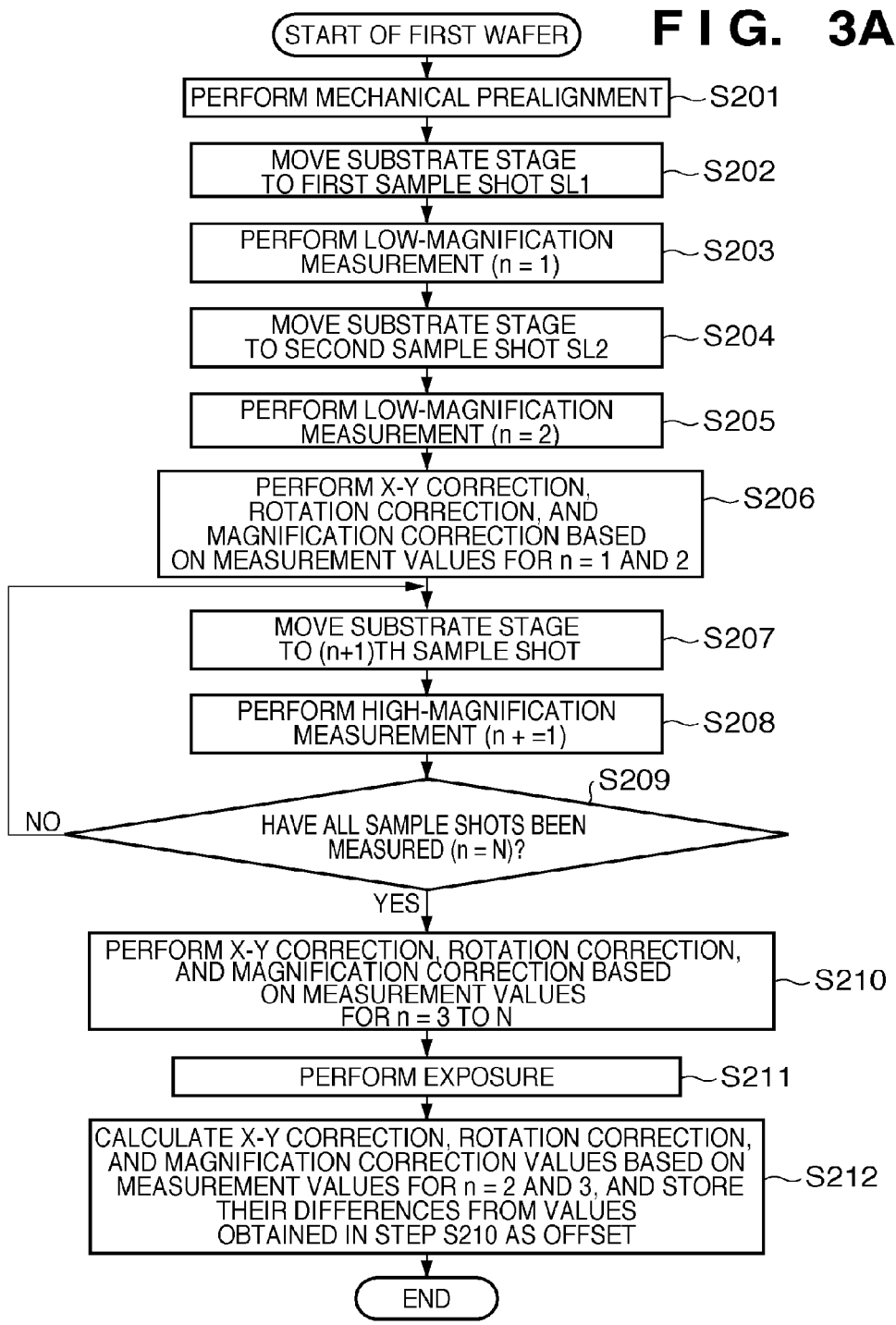

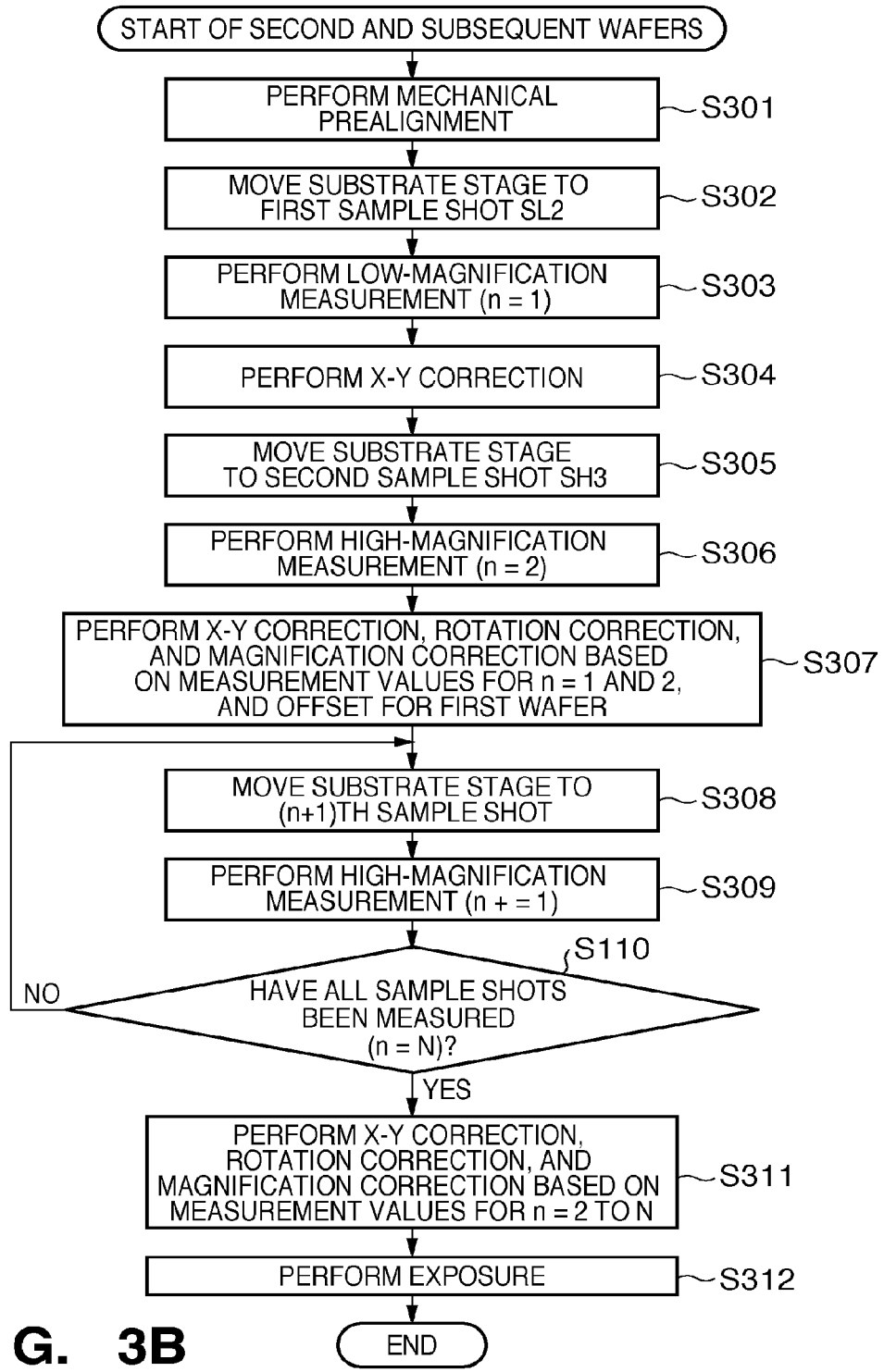
F I G. 3B

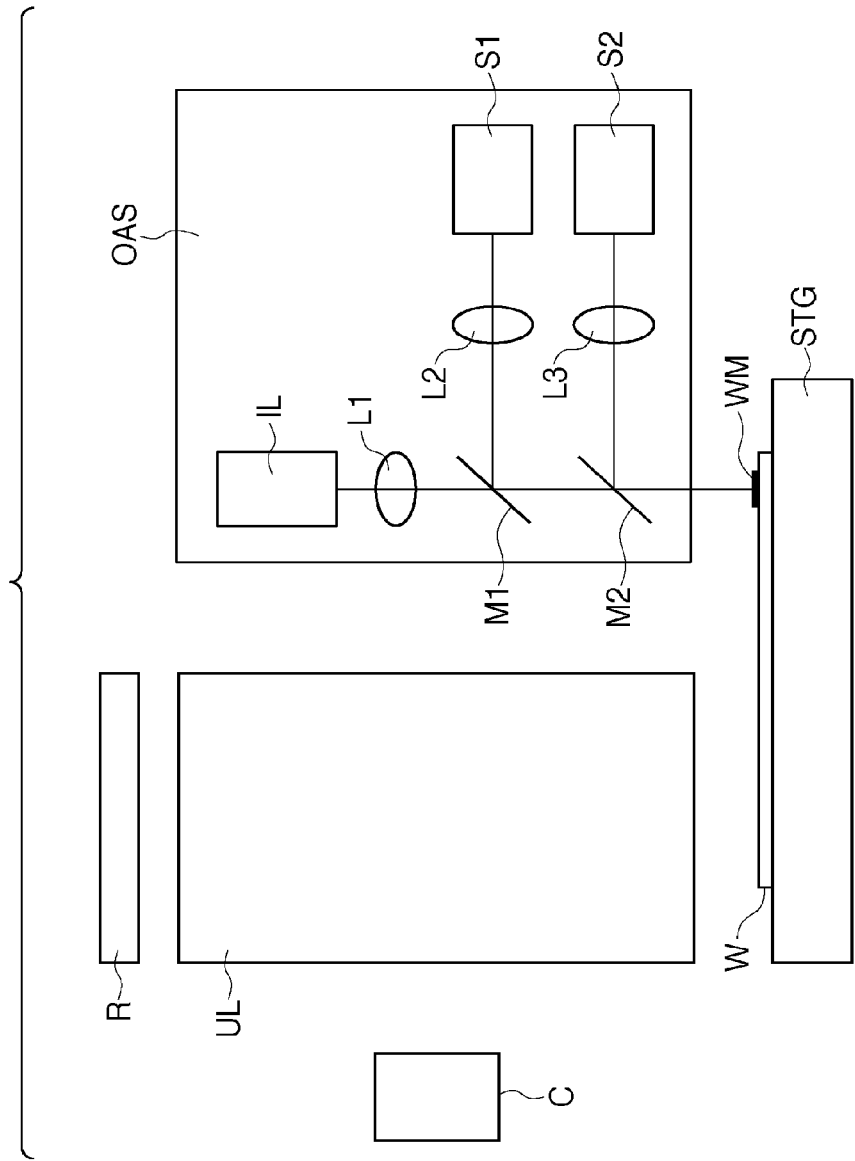

EXPOSURE METHOD, EXPOSURE APPARATUS, AND METHOD OF MANUFACTURING DEVICE

BACKGROUND OF THE INVENTION

1. Field of the Invention

The present invention relates to an exposure method, an exposure apparatus, and a method of manufacturing a device.

2. Description of the Related Art

Wafer processing principally includes alignment processing such as prealignment and global alignment for aligning a wafer, and exposure processing. To improve the wafer productivity, that is, the throughput, various efforts are made to shorten the time taken for each processing.

In alignment processing, a plurality of marks is selected from alignment marks formed on the wafer as sample shots, and the positions of these marks are measured. The sample shots used are as shown in FIG. 4. A low-magnification alignment mark WML and high-magnification alignment mark WMH are formed in each shot. In prealignment, the position of the low-magnification alignment mark in a first sample shot SL1 is measured using a low-magnification scope first, and that of the low-magnification alignment mark in a sample shot SL2 is measured next. Wafer prealignment is performed based on the measured positions of the two low-magnification alignment marks SL1 and SL2.

After the wafer prealignment is performed, global alignment, that is, main alignment of the wafer is performed. In global alignment, several shots on the wafer are measured by taking account of a tradeoff between the productivity of ICs or LSIs and the alignment accuracy. For example, to attain a sample shot arrangement optimum for global alignment, sample shots are arranged outside as much as possible, except the wafer periphery, so as to be nearly symmetrical about the wafer center and nearly uniformly distributed on the circumference. In global alignment, the positions of high-magnification alignment marks are measured in the order of sample shots SH3, SH4, SH5, and SH6 using a high-magnification scope, thereby performing main alignment of the wafer.

After the main alignment is performed, the wafer stage is driven to a first exposure shot E1, and it is exposed. Subsequently, each shot is exposed while driving the wafer stage.

Japanese Patent Laid-Open Nos. 2005-217333 and 2001-267229 disclose details of this conventional method.

The above-mentioned conventional method is effective for a semiconductor exposure apparatus which exposes a wafer by quickly, precisely aligning it. However, the conventional method requires a long alignment time because, for prealignment, it measures the positions of two low-magnification alignment marks on each wafer to be exposed.

SUMMARY OF THE INVENTION

It is an object of the present invention to provide an exposure method and exposure apparatus which improve the throughput by shortening the alignment time.

According to the first aspect of the present invention, there is provided an exposure method of exposing a substrate by aligning the substrate using a mark formed on the substrate, the method comprising a first detection step of detecting a position of a first mark by a first scope, a second detection step of detecting a position of a second mark different from the first mark by a second scope having a magnification higher than a magnification of the first scope, a first calculation step of calculating a first correction value based on the detection results obtained in the first detection step and the second detection step, a third detection step of detecting a position of a third mark different from the first mark and the second mark by the second scope after the substrate is aligned based on the first correction value calculated in the first calculation step, a second calculation step of calculating a second correction value based on the detection results obtained in the second detection step and the third detection step, and an exposure step of exposing the substrate after the substrate is aligned based on the second correction value calculated in the second calculation step.

According to the second aspect of the present invention, there is provided an exposure method of exposing a plurality of substrates by sequentially aligning the substrates using marks formed on the substrates, the method comprising: a first calculation step of calculating a first correction value based on a result of detecting a position of a first mark on a first substrate by a first scope, and a result of detecting a position of a second mark different from the first mark on the first substrate by a second scope having a magnification higher than a magnification of the first scope, a second calculation step of calculating a second correction value based on the position of the second mark on the first substrate, and a result of detecting a position of a third mark different from the first mark and the second mark on the first substrate by the second scope, a determination step of determining an offset between the first correction value and the second correction value, a first detection step of detecting by the first scope a position of a first mark on a second substrate, to be exposed after the first substrate is exposed, a second detection step of detecting a position of a second mark different from the first mark on the second substrate by the second scope, a third calculation step of calculating a third correction value based on the detection results obtained in the first detection step and the second detection step, and the offset determined in the determination step, a third detection step of detecting a position of a third mark different from the first mark and the second mark on the second substrate by the second scope after the second substrate is aligned based on the third correction value calculated in the third calculation step, a fourth calculation step of calculating a fourth correction value based on the detection results obtained in the second detection step and the third detection step, and an exposure step of exposing the second substrate after the second substrate is aligned based on the fourth correction value calculated in the fourth calculation step.

According to the third aspect of the present invention, there is provided an exposure apparatus which exposes a substrate by aligning the substrate using a mark formed on the substrate, the apparatus comprising a substrate stage which holds the substrate, a first scope which observes a mark, a second scope having a magnification higher than a magnification of the first scope, and a controller which controls the first scope, the second scope, and the substrate stage, wherein the controller controls the first scope, the second scope, and the substrate stage so that the first scope detects a position of a first mark, the second scope detects a position of a second mark different from the first mark, the controller calculates a first correction value based on the detection results of the positions of the first mark and the second mark, the second scope detects a position of a third mark different from the first mark and the second mark after the substrate is aligned using the substrate stage based on the calculated first correction value, the controller calculates a second correction value based on the detection results of the second mark and the third mark, and the apparatus exposes the substrate after the substrate is aligned using the substrate stage based on the calculated second correction value.

According to the fourth aspect of the present invention, there is provided an exposure apparatus which exposes a plurality of substrates by sequentially aligning the substrates using marks formed on the substrates, the apparatus comprising, a substrate stage which holds the substrates, a first scope which observes a mark, a second scope having a magnification higher than a magnification of the first scope, and a controller which controls the first scope, the second scope, and the substrate stage, wherein the controller controls the first scope, the second scope, and the substrate stage so that the controller calculates a first correction value based on a result of detecting a position of a first mark on a first substrate by the first scope, and a result of detecting a position of a second mark different from the first mark on the first substrate by the second scope, the controller calculates a second correction value based on the position of the second mark on the first substrate, and a result of detecting a position of a third mark different from the first mark and the second mark on the first substrate by the second scope, the controller determines an offset between the first correction value and the second correction value, the first scope detects a position of a first mark on a second substrate to be exposed after the first substrate is exposed, the second scope defects a position of a second mark different from the first mark on the second substrate, the controller calculates a third correction value based on the detection results of the positions of the first mark and the second mark, and the offset, the second scope detects a position of a third mark different from the first mark and the second mark on the second substrate after the second substrate is aligned using the substrate stage based on the calculated third correction value, the controller calculates a fourth correction value based on the detection results of the positions of the second mark and the third mark, and the apparatus exposes the second substrate after the second substrate is aligned using the substrate stage based on the calculated fourth correction value.

According to the present invention, it is possible to provide an exposure method and exposure apparatus which improve the throughput by shortening the alignment time.

Further features of the present invention will become apparent from the following description of exemplary embodiments with reference to the attached drawings.

BRIEF DESCRIPTION OF THE DRAWINGS

FIG. 2 is a view for explaining samples shots and alignment marks according to the first embodiment;

FIG. 3A is a flowchart illustrating an exposure method for a first substrate according to the second embodiment;

FIG. 3B is a flowchart illustrating an exposure method for a second substrate according to the second embodiment;

FIG. 5 is a view for explaining the arrangement of an exposure apparatus.

DESCRIPTION OF THE EMBODIMENTS

FIG. 5 shows an example of an exposure apparatus for manufacturing a semiconductor used in the present invention. Referring to FIG. 5, reference symbol R denotes a reticle; and W, a substrate (wafer) on which sample shots in which low-magnification alignment marks WML and high-magnification alignment marks WMH, as shown in FIG. 2, and the like are formed are arranged in a grid pattern. Reference symbol UL denotes a projection optical system whose optical axis is the Z-axis. Reference symbol OAS is an off-axis image sensing unit which can observe the alignment mark at a plurality of magnifications. Reference symbol IL denotes a mark illumination unit; M1 and M2, beam splitters; L1 to L3, imaging optical systems; and STG, a substrate stage for holding the substrate W which can move three-dimensionally. Reference symbol S1 denotes a first scope for low-magnification observation; and S2, a second scope for high-magnification observation, which has a magnification higher than that of the first scope S1. The first and second scopes S1 and S2 are connected to an image processing unit (not shown) and can measure the position of the alignment mark from the sensed mark image.

The exposure apparatus includes a mechanical prealignment unit (not shown). A controller C controls the mechanical prealignment unit, off-axis image sensing unit OAS, and substrate stage STG.

First Embodiment

Figure 1:
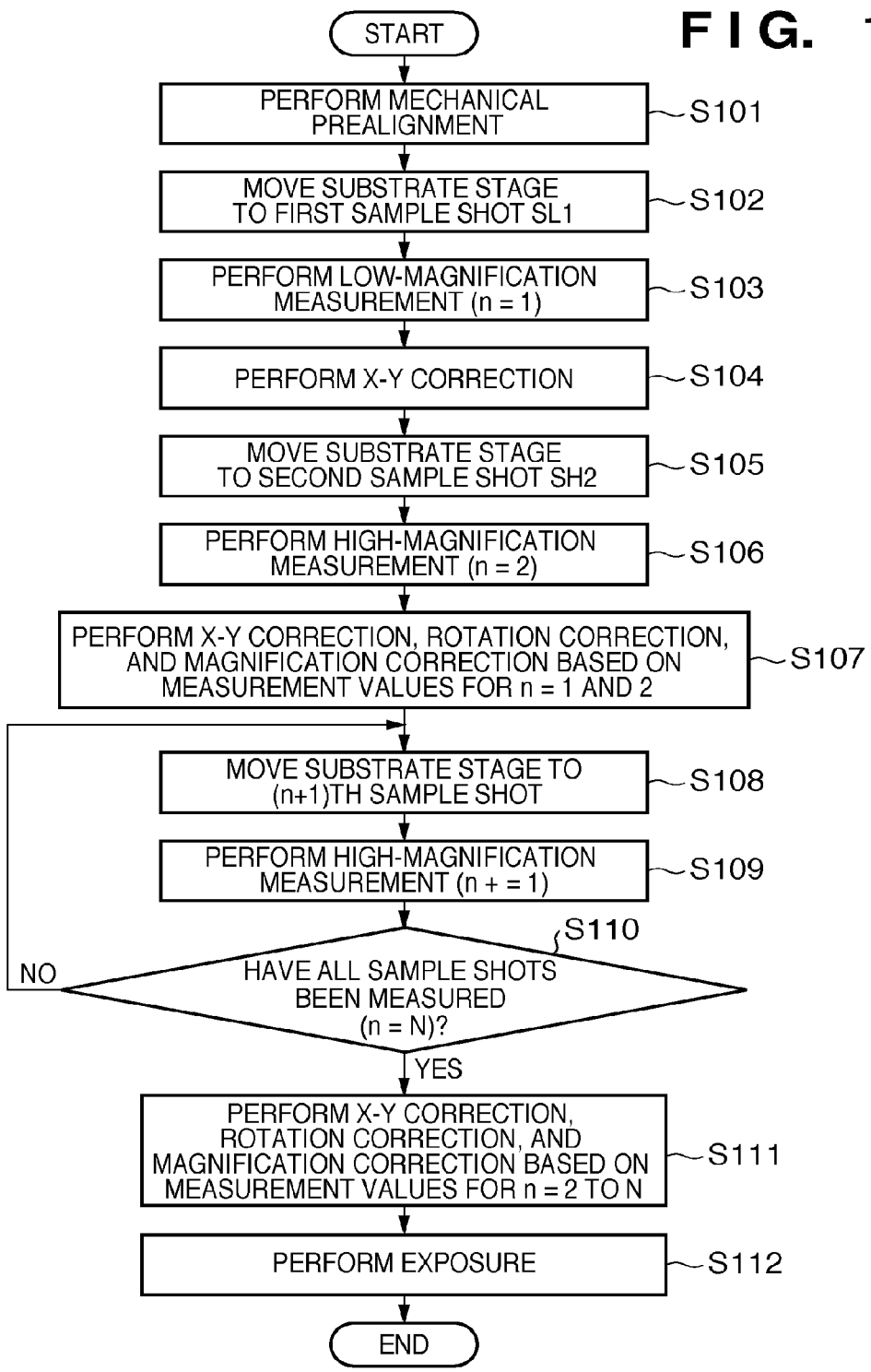
FIG. 1 is a flowchart illustrating an exposure method according to the first embodiment.

An example of alignment processing according to the present invention will be explained with reference to FIG. 1. In step S101, a controller C controls a mechanical prealignment unit (not shown) to perform mechanical prealignment of a substrate W. In this step, mechanical prealignment is performed for the wafer with reference to the notched portion and periphery of the wafer, such as an orientation flat and notch. In step S102, the controller C drives a substrate stage so that a low-magnification alignment mark WML in a first sample shot SL1, which serves as a first mark, falls within the observation range of a low-magnification scope S1 serving as a first scope with reference to the mechanical prealignment result. In step S103, the controller C controls the low-magnification scope S1 to measure the position of the low-magnification alignment mark WML in the first sample shot SL1. Step S103 is a first detection step of detecting the position of a first mark by a first scope.

In step S104, the controller C performs correction (shift correction) by shifting the wafer in the X and Y directions with reference to the position of the low-magnification alignment mark WML in the first sample shot SL1. In step S105, the controller C drives the substrate stage so that a high-magnification alignment mark WMH in a second sample shot SH2 shown in FIG. 2, which serves as a second mark, falls within the observation range of a high-magnification scope S2 serving as a second scope. A sample shot which falls within a range (shaded region) defined by the distance between the sample shot and the first sample shot SL1, at which the mark in the sample shot is allowed to enter the observation range of the high-magnification scope S2 only by shift correction from the first sample shot SL1 even when the wafer has a rotation error or a magnification error, is selected as the second sample shot SH2. That is, the second mark is selected from marks arranged at positions from which they are allowed to enter the field of the second scope only by shift correction based on the detection result obtained in the first detection step. The shaded region is determined in accordance with the mechanical prealignment accuracy and the accuracy of forming a pattern in lower layers.

In step S106, the controller C controls the high-magnification scope S2 to measure the high-magnification alignment mark WMH in the second sample shot SH2. Step S106 is a second detection step or detecting a second mark different from the first mark by a second scope.

In step S107, the controller C performs prealignment (shift correction, rotation correction, and magnification correction) based on the measurement values obtained in steps S103 and S106. Note that the rotation correction means correction by rotating the wafer, and the magnification correction means correction by changing the magnification of the wafer. Step S107 is a first calculation step of calculating a first correction value based on the detection results obtained in the first and second detection steps.

In step S108, the controller C drives the substrate stage to the next sample shot based on the first correction value obtained in step S107. In step S109, the controller C controls the high-magnification scope S2 to perform high-magnification measurement of the next sample shot. Steps S108 and S109 are a third detection step of detecting the position of a third mark by the second scope after the substrate is aligned based on the first correction value.

If it is determined in step S110 that all sample shots have been measured, the controller C performs global alignment based on the measurement values in the second sample shots SH2 to SHN in step S111. In step S112, the controller C exposes an exposure shot E1. The last sample shot SHN to undergo high-magnification measurement is SH5 in FIG. 2. Step S111 is a second calculation step of calculating a second correction value based on the detection results obtained in the second and third detection steps. Step S112 is an exposure step of exposing the substrate after it is aligned based on the second correction value calculated in the second calculation step. Note that, in this embodiment, the positions of the sample shots SH3 to SH5 with reference to a third mark are detected in the third detection step.

In this embodiment, the second sample shot SH2 is selected from the shaded region shown in FIG. 2. However, prealignment can be performed with high accuracy when a sample shot which falls within the shaded region and is located farthest from the first sample shot SL1 is selected as the second sample shot SH2. That is, the second mark is preferably a mark which is allowed to enter the field of the second scope only by shift correction based on the detection result obtained in the first detection step, and which is located farthest from the first mark.

In this embodiment, shift correction, rotation correction, and magnification correction are performed during the prealignment in step S107. However, all of these types of correction need not always be performed if a good mechanical prealignment accuracy and a good accuracy of forming a pattern in lower layers can be ensured. In this case, at least one type of prealignment of shift correction, rotation correction, and magnification correction need only be performed.

Although the low-magnification alignment mark WML and high-magnification alignment mark WMH have different shapes in this embodiment, the same mark may be used.

The positions of the alignment marks in sample shots subsequent to the second sample shot SH2 may be measured using both the low-magnification scope S1 and high-magnification scope S2, as described in Japanese Patent Laid-Open No. 2004-158741. If the alignment mark falls outside the observation range of the high-magnification scope S2, a recovery operation such as an operation of bringing the alignment mark into the high-magnification observation range again based on the measurement value obtained by the low-magnification scope S1 and measuring it may be performed.

In this embodiment, the mark position in a first sample shot is measured by a low-magnification scope, shift correction is performed based on the obtained measurement value, and the mark position in a second sample shop is measured by a high-magnification scope. Based on the measurement values in the first and second sample shots, prealignment correction is performed. Hence, low-magnification measurement need only be performed in one sample shot in place of two sample shots, unlike the prior art. This shortens the prealignment processing time, thus improving the throughput.

Second Embodiment

The second embodiment relates to an exposure method of exposing a plurality of substrates by sequentially aligning them using marks formed on them.

In the first embodiment, prealignment is performed using the measurement values of the alignment marks in different sample shots, which are obtained by two scopes having different magnifications. For this reason, a prealignment correction value is often not precisely calculated in step S107 if there is an offset between the observation centers of the low-magnification scope S1 and the high-magnification scope S2 or there is a drawing offset or the like between the marks. This may make it impossible to perform high-magnification measurement subsequent to step S108. To avoid this situation, the second embodiment in which prealignment can be performed precisely even when there is an offset between the scopes or marks will be explained with reference to FIGS. 3A and 3B.

As for the first wafer, two sample shots are measured by a low-magnification scope S1, like the prior art, to be able to precisely perform prealignment even when there is an offset between the scopes or marks.

Figure 4:
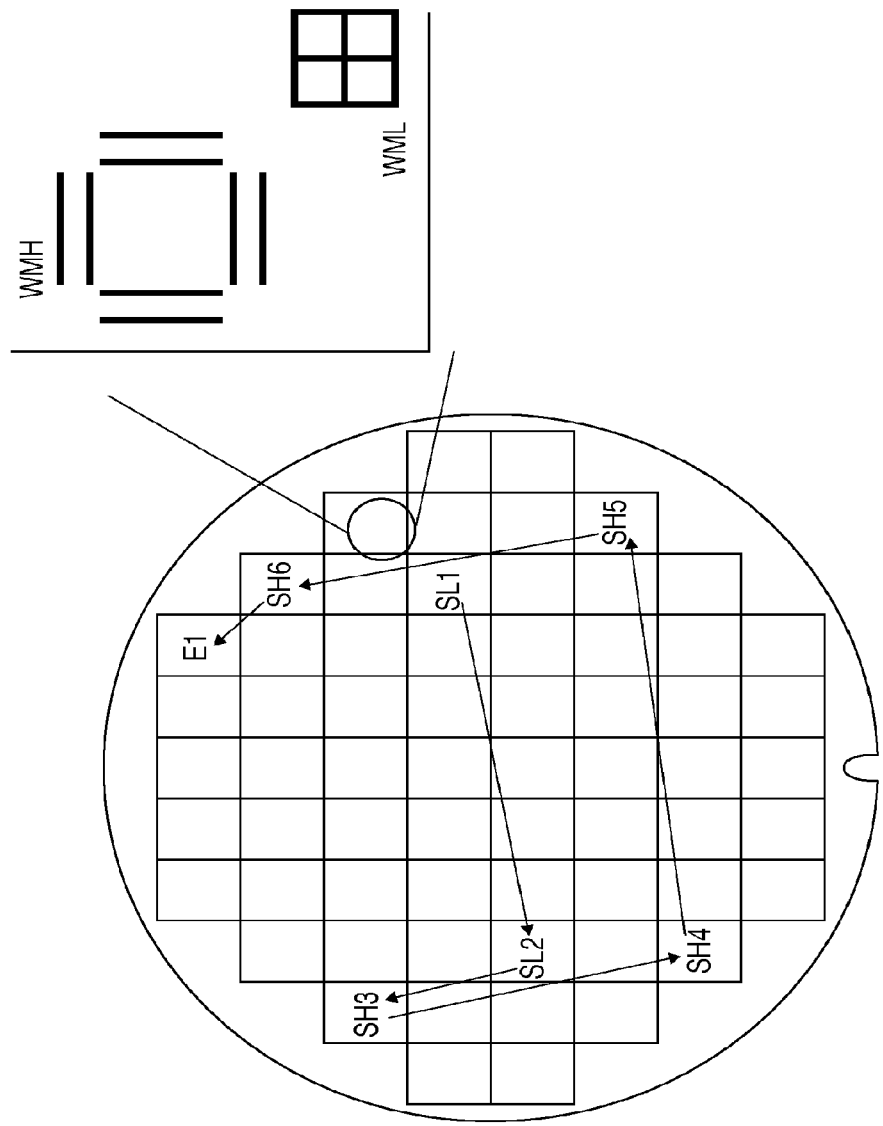
FIG. 4 is a view for explaining sample shots and alignment marks according to the second embodiment.

FIG. 3A is a flowchart illustrating alignment processing for a wafer to be exposed first in a lot, which serves as a first substrate. In step S201, a controller C controls a mechanical prealignment unit (not shown) to perform mechanical prealignment. In steps S202 to S206, the controller C controls the low-magnification scope S1 to measure low-magnification alignment marks WML in sample shots SL1 and SL2 shown in FIG. 4, and performs prealignment based on the obtained measurement values. In steps S207 to S210, the controller C controls a high-magnification scope S2 to measure sample shots SH3 to SHN, and performs global alignment based on the obtained measurement values. The controller C determines an offset as the difference between a prealignment correction value and a global alignment correction value during, for example, exposure, and controls a storage unit to store the determined offset (S212). Step S212 is a determination step of determining an offset between a first correction value and a second correction value for a first substrate.

As for wafers to be exposed second and subsequent times, prealignment correction values are calculated from the measurement values of the low-magnification alignment marks and high-magnification alignment marks in the same way as in the first embodiment. To obtain an offset for the first wafer, a prealignment correction value (first correction value) including an X correction value PREx, Y correction value PREy, rotation correction value PREθ, and magnification correction value PREmag is calculated based on the low-magnification measurement sample shot SL2 and high-magnification measurement sample shot SH3 to be used for prealignment of the second wafer. The difference between the calculated prealignment correction value and a global alignment correction value (second correction value) which includes an X correction value AGAx, Y correction value AGAy, X rotation correction value AGAθx, Y rotation correction value AGAθy, X magnification correction value AGAmagx, and Y magnification correction value AGAmagy, and is used for exposure is calculated by:

$$OFFSETx = AGAx - PREx$$

$$OFFSETy = AGAy - PREy$$

$$OFFSET\theta x = AGA\theta x - PRE\theta$$

$$OFFSET\theta y = AGA\theta y - PRE\theta$$

$$OFFSETmagx = AGAmagx - PREmag$$

$$OFFSETmagy = AGAmagy - PREmag$$

and the calculated difference is stored as an offset (S212).

Prealignment uses a correction value calculated from the measurement values in two sample shots, so the X- and Y-axis components for rotation correction and magnification correction are common to each other. In contrast, global alignment uses a correction value calculated from a large number of (in this embodiment, four) sample shots, so the X- and Y-axis components are individually obtained for these types of correction. Therefore, the X- and Y-axis components of the rotation correction value and magnification correction value in the offset are controlled individually.

FIG. 3B is a flowchart illustrating the sequence of alignment processing for the second and subsequent wafers serving as second substrates to be exposed after the first substrate is exposed. In step S301, the controller C controls the mechanical prealignment unit to perform mechanical prealignment with reference to the wafer periphery. In step S302, the controller C drives the substrate stage so that a low-magnification alignment mark WML in a first sample shot SL2 falls within the observation range of the low-magnification scope S1 with reference to the mechanical prealignment result.

In step S303, the controller C controls the low-magnification scope S1 to measure the position of the low-magnification alignment mark WML. Step S303 is a first detection step of detecting the position of a first mark on a second substrate by a first scope. In step S304, the controller C performs shift correction (X-Y correction) of the wafer with reference to the position of the low-magnification alignment mark WML.

In step S305, the controller C drives the substrate stage so that a high-magnification alignment mark WMH in a second sample shot SH3 falls within the observation range of the high-magnification scope S2. A sample shot which falls within a range (shaded region) defined by the distance between the sample shot and the first sample shot SL2, at which the mark in the sample shot is allowed to enter the observation range of the high-magnification scope S2 only by shift correction from the first sample shot SL2 even when the wafer has a rotation error or a magnification error, is selected as the second sample shot SH3. The shaded region is determined in accordance with the mechanical prealignment accuracy and the accuracy of forming a pattern in lower layers.

In step S306, the controller C controls the high-magnification scope S2 to measure the high-magnification alignment mark WMH in the second sample shot SH3. Step S306 is a second detection step or detecting the position of a second mark on a second substrate by a second scope.

In step S307, the controller C calculates a prealignment correction value including an X correction value PREx, Y correction value PREy, rotation correction value PREθ, and magnification correction value PREmag, based on the measurement values obtained in steps S303 and S306. At this time, the controller C performs prealignment based on a correction value which includes an X correction value PREx', Y correction value PREy', X rotation correction value PREθx', Y rotation correction value PREθy', X magnification correction value PREmagx', and Y magnification correction value PREmagy', and which takes account of the offset calculated in step S212 during the processing of the first wafer as follows:

$$PREx'=OFFSETx+PREx$$

$$PREy'=OFFSETy+PREy$$

$$PRE\theta x'=OFFSET\theta x+PRE\theta$$

$$PRE\theta y'=OFFSET\theta y+PRE\theta$$

$$PREmagx'=OFFSETmagx+PREmag$$

$$PREmagy'=OFFSETmagy+PREmag$$

Step S307 is a third calculation step of calculating a third correction value based on the detection results obtained in the first and second detection steps, and the offset between the first correction value and the second correction value.

In step S308, the controller C drives the substrate stage based on the correction value obtained in step S307. In step S309, the controller C controls the high-magnification scope S2 to perform high-magnification measurement of sample shots SH4 to SHN. Steps S308 and S309 are a third detection step of detecting the position of a third mark different from the first and second marks on the second substrate after the second substrate is aligned based on the third correction value.

If it is determined in step S310 that all sample shots have been measured, the controller C performs global alignment in step S311. In step S312, the controller C performs exposure processing. Step S311 is a fourth calculation step of calculating a fourth correction value based on the detection results obtained in the second and third detection steps. Step S312 is an exposure step of exposing the second substrate after it is aligned based on the fourth correction value.

In the second embodiment, the difference between the prealignment correction value and the global alignment correction value for the first wafer is stored as an offset between the first correction value and the second correction value. The use of this offset for prealignment of the second and subsequent wafers allows precise prealignment even when there is an offset between the scopes or marks.

In this embodiment, the X- and Y-axis components of offsets for rotation correction and magnification correction are controlled individually. However, if the difference between the X- and Y-axis components is negligible, their averages for these types of correction may be used as common offsets.

Also in this embodiment, an offset obtained for the first wafer is used to prealign the second and subsequent wafers. That is, the first substrate is a substrate to be exposed first in a lot, and the second substrate is each of substrates to be exposed second and subsequent times in the lot.

However, a wafer to determine an offset need not be particularly limited to the first wafer. For example, to prealign the Mth wafer, an offset may be calculated by statistically processing the difference between the first correction value and the second correction value, which is calculated for each of at least some of a plurality of wafers exposed prior to the Mth wafer.

Alternatively, the average value, mode value, or median value of the differences between the first correction values and the second correction values calculated for all of (M−1) wafers exposed prior to the Mth wafer may be calculated, thereby using the calculated value to prealign the Mth wafer. In this case, any abnormal values may be eliminated.

[Method of Manufacturing Device]

An embodiment of a method of manufacturing a device using the above-described exposure apparatus will be explained next.

Devices (for example, a semiconductor integrated circuit device and a liquid crystal display device) are manufactured by an exposure step of exposing a substrate to radiant energy using the exposure apparatus according to the above-described embodiments, a development step of developing the substrate exposed in the exposure step, and other known steps (for example, etching, resist removal, dicing, bonding, and packaging steps).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-051114, filed Feb. 29, 2008, which is hereby incorporated by reference herein in its entirety.

What is claimed is:

1. An alignment method by aligning a substrate using a mark formed on the substrate, the method comprising:
 a first detection step of detecting a position of a first mark by detecting the first mark using a first scope;
 a shift step of shifting the substrate, based on a shift correction value obtained from a detection result in the first detection step, from a position of the substrate where the first mark was detected by the first scope to a position of the substrate where a second mark, different from the first mark, enters a field of a second scope, the magnification of which is higher than the magnification of the first scope of the first detection step;
 a second detection step of detecting a position of the second mark which has entered the field of the second scope, the magnification of which is higher than the magnification of the first scope of the first detection step, by detecting the second mark using the second scope, the magnification of which is higher than the magnification of the first scope of the first detection step, without detecting a position of the second mark by detecting the second mark using the first scope;
 a first calculation step of calculating a first correction value based on the result of detecting the position of the first mark and the result of detecting the position of the second mark;
 a third detection step of detecting a position of a third mark different from the first mark and the second mark by detecting the third mark using the second scope, the magnification of which is higher than the magnification of the first scope of the first detection step after the substrate is aligned based on the first correction value; and
 a second calculation step of calculating a second correction value based on the result of detecting the position of the second mark and the result of detecting the position of the third mark;
 wherein the second mark is selected from marks arranged at positions from which the marks are allowed to enter the field of the second scope of the second detection step, correcting the position of the substrate by the shift correction value.

2. The method according to claim 1, wherein the second mark is a mark located farthest from the first mark, of the marks arranged at the positions from which the marks are allowed to enter the field of the scope of the second detection step, correcting the position of the substrate by the shift correction value.

3. An alignment method by aligning a substrate using a mark formed on the substrate, the method comprising:
 a first detection step of detecting a position of a first mark by detecting the first mark using a first scope;
 a shift step of shifting the substrate, based on a shift correction value obtained from a detection result in the first detection step, from a position of the substrate where the first mark was detected by the first scope to a position of the substrate where a second mark, different from the first mark, enters a field of a second scope, the magnification of which is higher than the magnification of the first scope of the first detection step;
 a second detection step of detecting a position of the second mark which has entered the field of the second scope, the magnification of which is higher than the magnification of the first scope of the first detection step, by detecting the second mark using the second scope, the magnification of which is higher than the magnification of the first scope of the first detection step, without detecting a position of the second mark by detecting the second mark using the first scope;
 a first calculation step of calculating a first correction value based on the result of detecting the position of the first mark and the result of detecting the position of the second mark;
 a third detection step of detecting a position of a third mark different from the first mark and the second mark by detecting the third mark using the second scope, the magnification of which is higher than the magnification of the first scope of the first detection step after the substrate is aligned based on the first correction value; and
 a second calculation step of calculating a second correction value based on the result of detecting the position of the second mark and the result of detecting the position of the third mark;
 wherein in the third detection step, a plurality of marks different from the first mark and the second mark are detected.

4. A positioning apparatus which aligns a substrate by using a mark formed on the substrate, the apparatus comprising:
 a substrate stage which holds the substrate;
 a first scope of first magnification which observes the mark formed on the substrate; and
 a second scope of second magnification, the magnification of which is higher than the magnification of the first scope of first magnification; and
 a controller which controls the first scope of first magnification, the second scope of second magnification, and said substrate stage,
 wherein said controller controls the first scope of first magnification, the second scope of second magnification, and said substrate stage so that
 the first scope of first magnification detects a first mark and detects a position of a first mark,
 the substrate is shifted, based on a shift correction value obtained from a result of detecting a position of the first mark, from a position of the substrate where the first mark was detected by the first scope of first magnification to a position of the substrate where a second mark, different from the first mark, enters a field of the second scope of second magnification;
 the second scope of second magnification detects the second mark and detects a position of the second mark which has entered the field of the second scope of second magnification, without detecting a position of the second mark by detecting the second mark using the first scope,
 said controller calculates a first correction value based on the result of detecting the position of the first mark and the result of detecting the position of the second mark,
 the second scope of second magnification detects a third mark and detects a position of the third mark different from the first mark and the second mark after the substrate is aligned based on the calculated first correction value,
 said controller calculates a second correction value based on the detection result of the second mark and the detection result of the third mark, and the apparatus aligns the substrate based on the second correction value;

wherein the third mark includes a plurality of marks different from the first mark and the second mark.

5. An alignment method by aligning a substrate using a mark formed on the substrate, the method comprising:

a first detection step of detecting a position of a first mark by detecting the first mark using a first scope;

a shift step of shifting the substrate, based on a shift correction value obtained from a detection result in the first detection step, from a position of the substrate where the first mark was detected by the first scope to a position of the substrate where a second mark, different from the first mark, enters a field of a second scope, the magnification of which is higher than the magnification of the first scope of the first detection step;

a second detection step of detecting a position of the second mark which has entered the field of the second scope, the magnification of which is higher than the magnification of the first scope of the first detection step, by detecting the second mark using the second scope, the magnification of which is higher than the magnification of the first scope of the first detection step, without detecting a position of the second mark by detecting the second mark using the first scope;

a first calculation step of calculating a first correction value based on the result of detecting the position of the first mark and the result of detecting the position of the second mark;

a third detection step of detecting a position of a third mark different from the first mark and the second mark by detecting the third mark using the second scope, the magnification of which is higher than the magnification of the first scope of the first detection step after the substrate is aligned based on the first correction value; and a second calculation step of calculating a second correction value based on the result of detecting the position of the second mark and the result of detecting the position of the third mark.

6. A positioning apparatus which aligns a substrate by using a mark formed on the substrate, the apparatus comprising:

a substrate stage which holds the substrate;

a first scope of first magnification which observes the mark formed on the substrate;

a second scope of second magnification, the magnification of which is higher than the magnification of the first scope of first magnification; and a controller which controls the first scope of first magnification, the second scope of second magnification, and said substrate stage, wherein said controller controls the first scope of first magnification, the second scope of second magnification, and said substrate stage so that the first scope of first magnification detects a first mark and detects a position of a first mark, the substrate is shifted, based on a shift correction value obtained from a result of detecting a position of the first mark, from a position of the substrate where the first mark was detected by the first scope of first magnification to a position of the substrate where a second mark, different from the first mark, enters a field of the second scope of second magnification;

the second scope of second magnification detects the second mark and detects a position of the second mark which has entered the field of the second scope of second magnification, said controller calculates a first correction value based on the result of detecting the position of the first mark and the result of detecting the position of the second mark, the second scope of second magnification detects a third mark and detects a position of the third mark different from the first mark and the second mark after the substrate is aligned based on the calculated first correction value, said controller calculates a second correction value based on the detection result of the second mark and the detection result of the third mark, and the apparatus aligns the substrate based on the second correction value.

7. An alignment method by sequentially aligning a plurality of substrates using marks formed on the substrates, the method comprising:

a first calculation step of calculating a first correction value based on a result of detecting a position of a first mark on a first substrate by a first scope, and a result of detecting a position of a second mark different from the first mark on the first substrate by the first scope;

a second calculation step of calculating a second correction value based on the position of the second mark on the first substrate, and a result of detecting a position of a third mark different from the first mark and the second mark on the first substrate by a second scope, the magnification of which is higher than the magnification of the first scope of the first calculation step;

a determination step of determining an offset between the first correction value and the second correction value;

a first detection step of detecting by the first scope of first calculation step a position of a first mark on a second substrate to be exposed after the first substrate is exposed;

a shift step of shifting the second substrate, based on a shift correction value obtained from a detection result in the first detection step, from a position of the second substrate where the first mark on the second substrate was detected by the first scope of first calculation step to a position of the second substrate where a second mark on the second substrate, different from the first mark on the second substrate, enters a field of a second scope of, the magnification of which is higher than the magnification of the first scope of the first calculation step;

a second detection step of detecting a position of the second mark on the second substrate which has entered the field of the second scope, the magnification of which is higher than the magnification of the first scope of the first calculation step, by the second scope, the magnification of which is higher than the magnification of the first scope of the first calculation step, without detecting a position of the second mark by detecting the second mark using the scope the magnification of which is the magnification of the scope of the first detection step;

a third calculation step of calculating a third correction value based on the detection result obtained in the first detection step and the detection result obtained in the second detection step, and the offset determined in the determination step;

a third detection step of detecting a position of a third mark on the second substrate different from the first mark and the second mark on the second substrate by a second scope, the magnification of which is higher than the magnification of the first scope of the first calculation step after the second substrate is aligned based on the third correction value; and a fourth calculation step of calculating a fourth correction value based on the detection result obtained in the second detection step and the detection result obtained in the third detection step.

8. A positioning apparatus which aligns a plurality of substrates by sequentially using marks formed on the substrates, the apparatus comprising:

a substrate stage which holds the substrates;

a first scope of first magnification which observes the mark formed on the substrate;

a second scope of second magnification, the magnification of which is higher than the magnification the first scope of first magnification; and a controller which controls the first scope of first magnification, the second scope of second magnification, and said substrate stage, wherein said controller controls the first scope of first magnification, the second scope of second magnification, and said substrate stage so that said controller calculates a first correction value based on a result of detecting a position of a first mark on a first substrate by the first scope of first magnification, and a result of detecting a position of a second mark on the first substrate different from the first mark on the first substrate by the first scope of first magnification, said controller calculates a second correction value based on the position of the second mark on the first substrate, and a result of detecting a position of a third mark on the first substrate different from the first mark on the first substrate and the second mark on the first substrate by the second scope of second magnification, said controller determines an offset between the first correction value and the second correction value, the first scope of first magnification detects a position of a first mark on a second substrate to be exposed after the first substrate is exposed, the second substrate is shifted, based on a shift correction value obtained from a result of detecting a position of the first mark on the second substrate, from a position of the second substrate where the first mark on the second substrate was detected by the first scope of first magnification to a position of the second substrate where a second mark on the second substrate enters a field of the second scope of second magnification;

second scope of second magnification detects a position of the second mark on the second substrate which has entered the field of the second scope of second magnification, said controller calculates a third correction value based on the detection result of the position of the first mark and the detection result of the position of the second mark, and the offset, the second scope of second magnification detects a position of a third mark on the second substrate different from the first mark on the second substrate and the second mark on the second substrate after the second substrate is aligned based on the third correction value, said controller calculates a fourth correction value based on the detection result of the position of the second mark on the second substrate and the detection result of the position of the third mark on the second substrate, and the apparatus aligns the second substrate based on the fourth correction value.

* * * * *